(12) United States Patent
Chan

(10) Patent No.: US 6,710,622 B1
(45) Date of Patent: Mar. 23, 2004

(54) PROGRAMMABLE DIGITAL ONE-SHOT

(75) Inventor: Wai Cheong Chan, Sunnyvale, CA (US)

(73) Assignee: National Semiconductor Corp, Santa Clara, CA (US)

( * ) Notice: Subject to any disclaimer, the term of this patent is extended or adjusted under 35 U.S.C. 154(b) by 0 days.

(21) Appl. No.: 10/121,179

(22) Filed: Apr. 12, 2002

(51) Int. Cl.[7] .............................................. H03K 19/173
(52) U.S. Cl. .............................. 326/38; 326/46; 326/93
(58) Field of Search ........................ 326/37, 38, 93–98, 326/105, 46, 82

(56) References Cited

U.S. PATENT DOCUMENTS

| | | | | |
|---|---|---|---|---|
| 4,231,104 A | * | 10/1980 | St. Clair | ............... 713/500 |
| 4,516,861 A | * | 5/1985 | Frew et al. | ............... 368/120 |
| 4,996,474 A | * | 2/1991 | Tambe et al. | ........... 324/76.48 |
| 5,272,687 A | * | 12/1993 | Matsushima | .............. 369/59.2 |
| 5,745,741 A | | 4/1998 | King | |
| 5,771,264 A | * | 6/1998 | Lane | ...................... 375/376 |
| 5,826,091 A | | 10/1998 | Shah et al. | |
| 5,877,639 A | | 3/1999 | Porcher et al. | |
| 6,133,771 A | | 10/2000 | Portaluri et al. | |
| 6,239,616 B1 | * | 5/2001 | Churcher et al. | ............... 326/49 |
| 6,239,627 B1 | * | 5/2001 | Brown et al. | ............... 327/116 |
| 6,466,520 B1 | * | 10/2002 | Speyer et al. | ............... 368/118 |
| 2002/0079972 A1 | * | 6/2002 | Su et al. | ...................... 331/1 |

* cited by examiner

*Primary Examiner*—Don Le
(74) *Attorney, Agent, or Firm*—Jurgen Vollrath

(57) ABSTRACT

In a one-shot, the pulse duration is adjustable through the use of a counter and one or more programmable delay lines in one or more of the feedback loops of the one-shot. The one-shot makes use of at least two flip-flops, and the output of the counter resets the flip-flops.

10 Claims, 3 Drawing Sheets

PROGRAMMABLE DIGITAL ONE-SHOT

FIELD OF THE INVENTION

The invention relates to the field of electronics. In particular, the invention deals with a one-shot circuit.

BACKGROUND OF THE INVENTION

The monostable multivibrator or one-shot is a circuit that produces a pulse of a certain duration, in response to an input pulse or trigger. One way of producing a pulse of desired duration, is through the use of a delay line that provides a fixed time delay. For instance, an input trigger can be fed directly into one of the inputs of an AND gate, and into the other input of the AND gate via a delay line that includes an inverter (e.g., an odd number of inverters).

The delay elements in such a circuit, are, however, subject to the same process variations as other components on a semiconductor chip, which can significantly influence the integrity of the output pulse.

The present invention seeks to provide a more flexible solution in which the duration of the output pulse of the one-shot need not be predecfined and fixed at the time of manufacture, and can take account of process variations.

SUMMARY OF THE INVENTION

The invention involves a new one-shot circuit which provides for multi-faceted programmable pulse width control, wherein at least one of the programming method comprises multiple selectable delay lines, while another takes the form of a programmable counter. The multiple selectable delay lines may be connected to each other through transmission gates selectable by a decoder for selecting one of multiple of delay lines. There may be more than one set of selectable delay lines. The circuit typically has a plurality of feedback loops, and each feedback loop may be provided with a set of selectable delay lines. The one-shot is typically implemented as at least two flip-flops, and a programmable counter/comparator.

According to the invention, there is provided a one-shot circuit comprising at least a first and a second flip-flop wherein the output of the first flip-flop is coupled to an input of the second flip-flop, and further comprising a counter coupled to the output of the second flip-flop, the output of the counter is coupled to the clear pins of those flip-flops. The circuit typically includes a first feedback loop with an inverter from an output of the second flip-flop to a clock input of the second flip-flop, and a second feedback loop from an output of the second flip-flop to a clear input of the second flip-flop. The feedback loop from the output of the second flip-flop to the input of the second flip-flop preferably includes a first programmable delay line. The feedback loop from the output of the second flip-flop to the clear input of the second flip-flop may include a second programmable delay line. The counter provides a direct adjustment for the period of the output pulse for the one-shot circuit. The second flip-flop with its feedback loops from its output to its clock and clear inputs defines an internal clock, and the programmable delay lines provide adjustments for the period of the internal clock signal.

Further, according to the invention, there is provided a one-shot circuit comprising at least a first flip-flop, a second flip-flop defining an internal clock, and a counter, wherein the internal clock causes the counter to count up and the counter serves to reset the first flip-flop once the counter has reached the value set by the program value. The circuit further comprises a first flip-flop coupled to an input of the second flip-flop. Preferably the counter is also coupled to a clear pin of the second flip-flop.

DETAILED DESCRIPTION OF THE INVENTION

Figure 1:
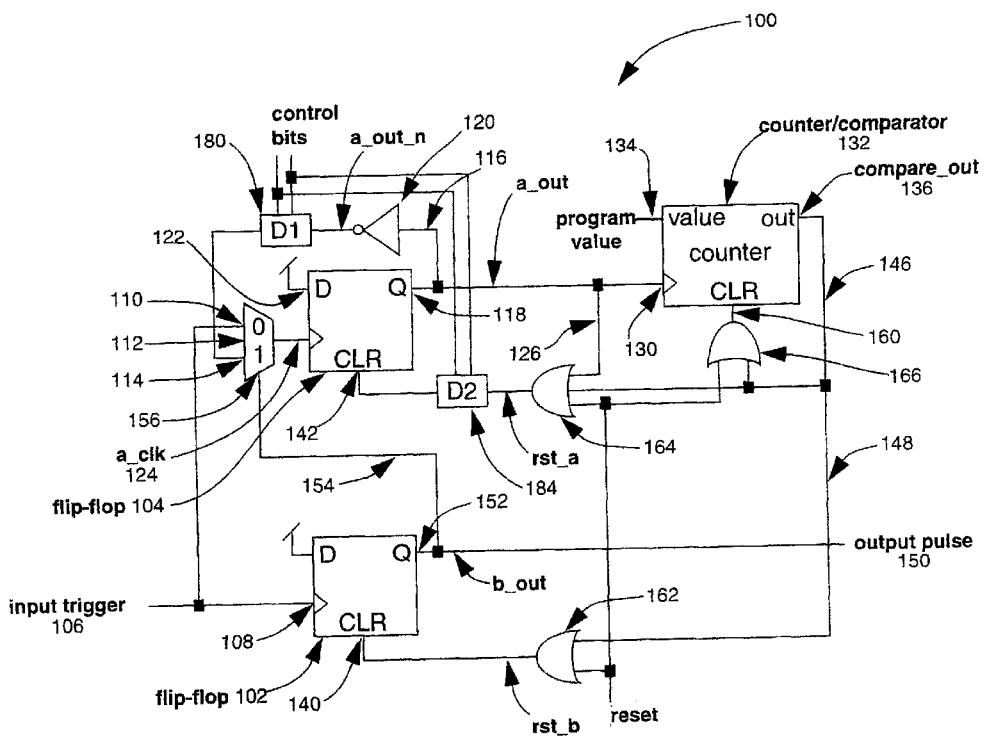
FIG. 1 is a schematic circuit diagram of one embodiment of a one-shot circuit of the invention.

FIG. 1 shows a schematic circuit diagram of one embodiment of a one-shot 100 of the invention. The one-shot 100 includes a first D-type flip-flop 102 and a second D-type flip-flop 104. An input trigger 106 is connected to the clock port 108 of the flip-flop 102 and to one input 110 of a multiplexer 112. The other input 114 of the multiplexer 112 is fed by a first feed-back loop 116 from the Q-output 118 of the flip-flop 104. As shown in FIG. 1, the first feedback loop 116 includes an inverter 120. The D-input 122 of flip-flop 104 is tied high. Flip-flop 104 acts as an internal clock for the circuit, the output 118 will start toggling in response to the rising edge of the signal presented to the input trigger line 106. Output 118 will continue to switch states through the actions of the signals in the feedback paths. The duration of the internal clock is determined by feedback loops 116 and 126 from the output 118 to the clock port 124 and clear (CLR) input 142, respectively.

The output 118 of the flip-flop 104 is also connected to the clock port 130 of a counter 132. The counter 132 is reset at power up by a reset signal and at the end of the output pulse. It counts up from zero with each pulse presented to the clock port 130. The output of the counter is constantly being compared to the program value entered into the counter 132 at the program value port 134. Once the counter 132 has reached that value, the output compare_out 136 goes from low to high and is presented to the clear (CLR) input 140 of the first flip-flop 102 (via the feedback loop 148) and to the clear (CLR) input 142 of the second flip-flop 104 (via the feedback loop 146).

The first flip-flop 102 is responsible for defining the start of the output pulse of the one-shot as presented at the output 150. Once the second flip-flop 104 has caused the counter 132 to reach the programmed value, the output from the counter 132 clears the first flip-flop 102. This causes the signal at the flip-flop's output 152 to go low. Thus, the circuit causes an output pulse to be generated, whose pulse width depends on the signal produced by the flip-flop 104 (which increments the counter) and the value programmed into the counter 132. In this embodiment a counter was described which counts up to a programmed value, and using a comparator determines when that value is reached. It will be appreciated that the invention could, instead, be implemented with a count-down counter.

A second feedback loop 154 from the output of the first flip-flop 102 is fed to the select input 156 of the multiplexer 112. Once the first flip-flop 102 is cleared by the signal from the counter 132, the multiplexer input 110 (which is connected to the input trigger 106) is fed through to the clock input 124 of the second flip-flop 104. Since the input trigger would, in the meantime, have gone low, it thus presents a low signal to the multiplexer 112, which is fed through to the clock port 124 to prepare the second flip-flop for the next input trigger pulse on the input trigger line 106. If the output pulse of the one-shot is shorter than the input trigger, the input trigger should be "conditioned" before presenting to the one-shot, as is discussed in greater detail with respect to the embodiment of FIG. 4. Whether the trigger signal to the one-shot comes directly from the input trigger or from the "conditioned" output can be made selectable through an input trigger selection signal.

It will be appreciated that the circuit will initially be reset using the rising edge of a reset pulse which is presented to the clear inputs 140, 142 of the flip-flops and the clear input 160 of the counter through OR gates 162, 164, 166, respectively.

Figure 2:
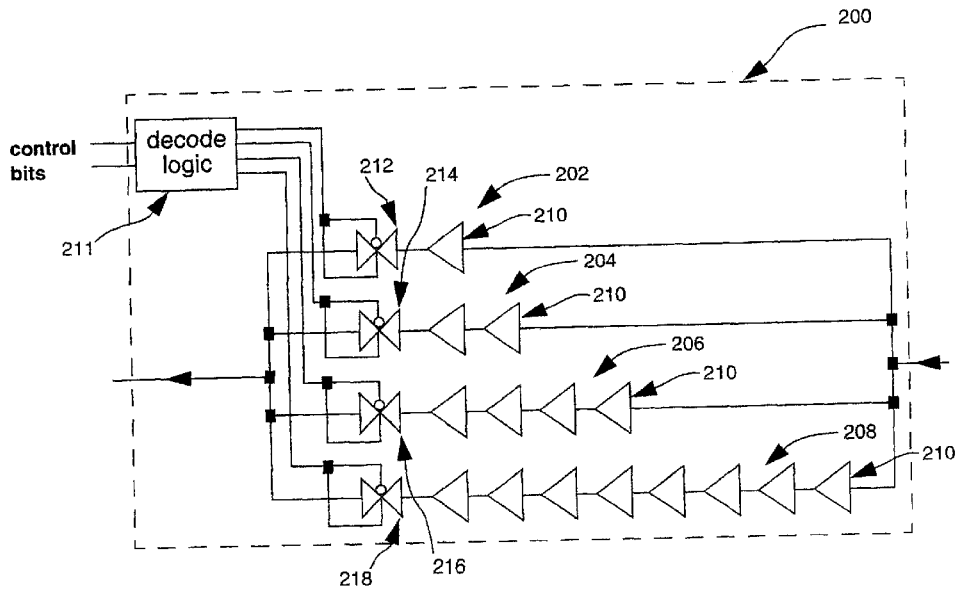
FIG. 2 is a schematic circuit diagram of one embodiment of a programmable delay line of the invention.

FIG. 1 also shows two programmable delay circuits 180, 184 included in the one-shot 100. The feedback loop 116, includes one of the programmable delay circuits 180, while feedback loops 126 and 146 are combined by OR gate 164, and include the programmable delay circuit 184. The programmable delay circuit is shown in detail in FIG. 2 and depicted generally by reference numeral 200. While, FIG. 1 shows the same set of control bits controlling each of the delay lines 180, 184, it will be appreciated that different sets of control lines with different control bits could be used for the two delay lines 180, 184.

The programmable delay circuit 200 comprises a set of delay structures 202, 204, 206, 208, each structure consisting of one or more delay elements which, for simplicity have been depicted by reference numeral 210. This, however, does not intend to imply that the delay elements need to be identical to each other. In this embodiment the elements comprise buffers. Each of the structures is connected to transmission gates 212, 214, 216, 218. One of the transmission gates can be selected at one time. This allows one of the structures to be selected and, hence, allows different delays to be programmed into the feedback loops depending on the code entered into the decoder 211. The rate of the internal clock can be tuned by adjusting the delay in the feedback loops 116 and 126. In this way the present invention allows the duration of the output pulse of the one-shot to be adjusted while limiting the size (number of bits) needed for the counter 132. This not only allows a saving of real estate on the chip, it also minimizes power dissipation in the counter when a long output pulse is required.

Figure 3:
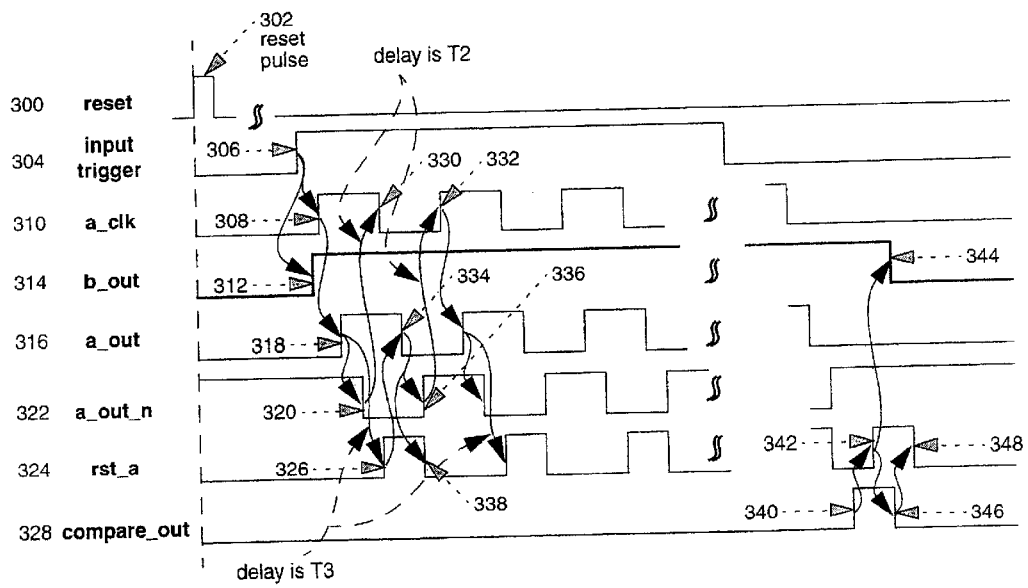
FIG. 3 is a timing diagram for the circuit of FIG. 1.

The working of the one-shot shown in FIG. 1 can be appreciated more easily when considered in conjunction with the timing diagram of FIG. 3. Waveform 300 shows the reset pulse 302 which resets the circuit at the beginning of the operation by clearing the two flip-flops 102, 104, and the counter 132. The states of the various signals before the arrival of the input trigger is as follows. All signals to the clear ports of flip-flops 102, 104 and the counter 132 are low. The output port 124 of the multiplexer 112 is fed from input trigger line 106 because the output of flip-flop 102 (152) is low. Since the output of flip-flop 104 (118) is low, the input port 114 of multiplexer 112 is high.

Waveform 304 shows the input trigger waveform on the input trigger line 106. Since the clock pins of both flip-flops 102 and 104 are receiving signals from the input trigger at this time, the rising edge 306 would cause flip-flops 102 and 104 to switch states, resulting in the rising edges 312 and 308. Due to the additional delay of the multiplexer 112, rising edge 308 is shown to be slightly behind the rising edge 312. When the output 152 of flip-flop 102 goes high, the select pin of multiplexer 112 changes to input port 114 which is also high at this time.

Responding to the rising edge 308, the output of multiplexer 104 changes state, resulting in the rising edge 318. Hence the inverted signal waveform 322 displays a falling edge 320. This signal is fed back and becomes the clock signal of flip-flop 104 through the input 114 of the multiplexer 112. Therefore, the clock signal of 104 will fall (falling edge 330). In the meantime, rising edge 318 causes the rising edge 326 in the output of OR gate 164. This is fed back to the clear pin 142 of flip-flop 104 to reset flip-flop 104, resulting in a falling edge 334 on the output 118. This falling edge has two effects. First, it removes the signal to the clear pin of multiplexer 104, as indicated by the falling edge 338. It also changes the state of the signal (a_out_n) in the feedback path 116 due to the inverter 120 (rising edge 336).

This rising edge 336 now causes the clock port 124 of multiplexer 104 to make a low to high transition (rising edge 332). Due to the rising edge 332, flip-flop 104 starts another cycle of state change. These switchings on the output 118 are used as clock signals for the counter 132 to advance its count. The above process repeats itself until the counter's count value matches the value programmed into the counter. When this occurs, the compare_out signal 328 will be asserted (rising edge 340).

Through the feedback path 146, the rising edge 340 causes the assertion of all the clear signals to the flip-flops and the counter. Because of this reset action, the output 152 of flip-flop 102 falls (falling edge 344) terminating the output pulse. When the counter is reset, it's value returns to zero which no longer compares with the program value, and compare_out also returns to low (falling edge 346). This also removes all signals to all clear pins (for example, falling edge 348 for flip-flop 104).

As the output 152 of flip-flop 102 returns to low, the clock pin of flip-flop 104 will be receiving the signal from the input trigger once again. If the input trigger pulse width is shorter than the desired one-shot output pulse width, the input trigger will already be low. Therefore, no additional activity will occur until the arrival of the next input trigger to start the whole process again.

From the operation of the one-shot circuit, it can be seen that the period of the signal produced by flip-flop 104 is controlled by the delay from the output 118 to the clock port 124 and from the output 118 to the clear pin 142. In the absence of delay circuits, these delays are of the order of clock-to-Q delay of a flip-flop, which is typically less than one nano-second. In order to obtain a larger output pulse width, it would require a large size (number of bits) counter. For a fixed size counter, a long output pulse width can, instead, be obtained by extending the period of the clock signal from flip-flop 104. This is accomplished by adding delays to the two feedback paths 116, 126. The delays in this embodiment are made programmable by adding decode and selection logic. By increasing the delay D1, the high time of 118 can be lengthened. The low time of 118, in turn, can be stretched out by increasing the delay D2. When the period of 118 is increased, the counter will advance at a slower frequency, resulting in a longer output pulse with the same size counter.

Figure 4:
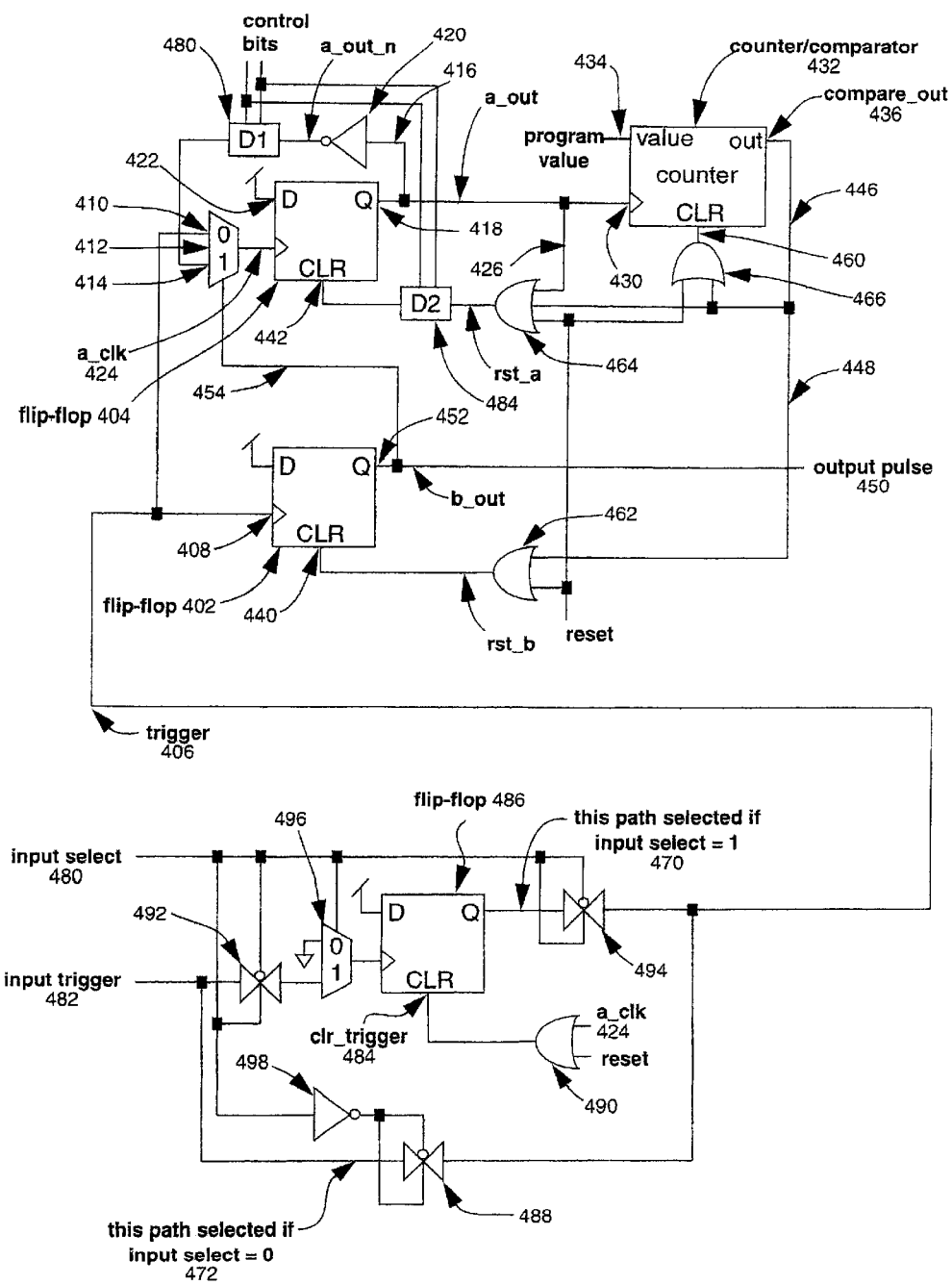
FIG. 4 is schematic circuit diagram of a second embodiment of a one-shot circuit of the invention with input trigger conditioning circuit.

In the case when the pulse width of the input trigger is expected to be longer than the output pulse, the input trigger signal should be "conditioned" before presenting it to the one-shot circuit. Otherwise, when the output pulse terminates, the high state at input 110 of the multiplexer 112 will cause flip-flop 104 to re-start the process. One implementation of the "conditioning" circuit is shown in FIG. 4, in which the one-shot circuit is put into motion by the rising edge of the trigger signal 406, which is the output of the "conditioning" circuit. The conditioning circuit includes an input select line 480 for selecting whether the input trigger should pass through the conditioning circuit or bypass the conditioning circuit. Thus, depending on the state of the input select pin 480, one of two potential signal paths is chosen for the input trigger signal on input trigger line 482: path 470 or path 472. If the input select is low, transmission gate 488 will open (transmission gates 492 and 494 will close) and the trigger line will receive the signal along path 472. Also, the multiplexer 496 will present a low signal to the clock pin of 486; therefore, flip-flop 486 is not active in this state. If the input select is high, transmission gate 492 and 494 will open (transmission gate 488 will close), and the trigger line will be driven by the output of flip-flop 486, along path 470. Also, the clock pin of 486 will be the input trigger signal 482.

Figure 5:
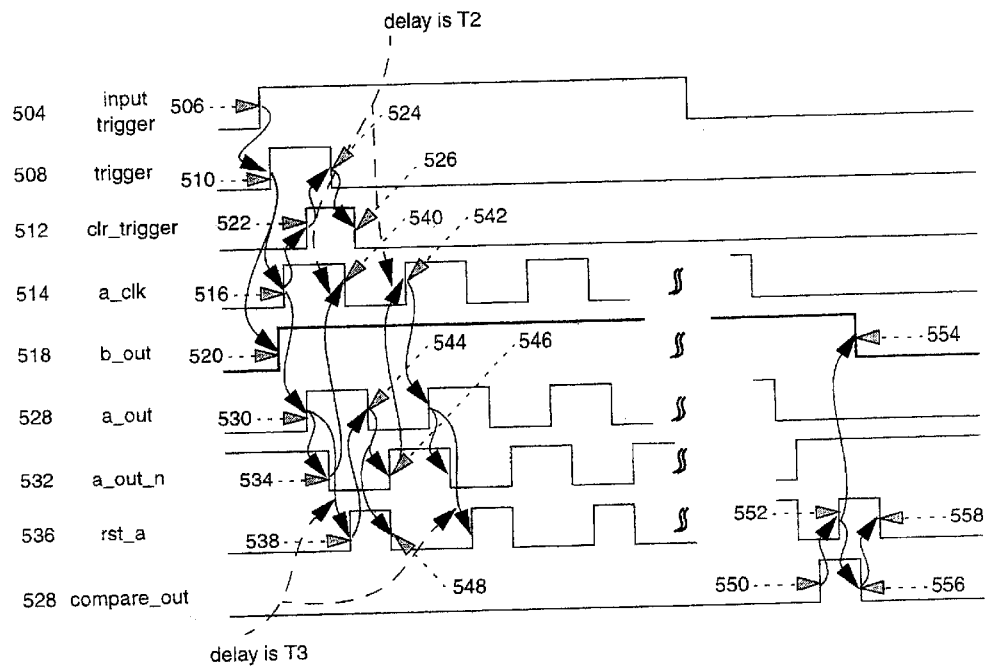
FIG. 5 is a timing diagram for the circuit of FIG. 4.

The operation of this one-shot (with input trigger conditioning) can be more easily understood in conjunction with the timing diagram FIG. 5. Again, it is assumed that the system has been reset through the reset pin. It is further assumed the input select pin is set so that the trigger line 406 is driven along path 470 (input select pin high).

On the rising edge 506 of the input trigger, the clock pin of flip-flop 486 will also see a rising edge. This rising edge causes flip-flop 486 to change state (from the reset state of low to high), resulting in the rising edge 510 on the trigger line 406. This rising edge is in turn presented to the clock pins of flip-flop 402 and 404. In response to this edge, the output of flip-flop 402 will go high, as shown by the rising edge 520. Once the rising edge 516 appears on the clock input of flip-flop 404, it generates a rising edge 522 on the clr_trigger signal 484 through the OR gate 490 by the feedback signal 424. In response to the clear signal, the output of flip-flop 484 returns to the low state. This concludes any activity on flip-flop 486, even though the signal 424 may continue to toggle within the duration of the output pulse. Since all toggling activity happens on the clear pin, therefore, the output of flip-flop 486 will remain low. From here on, the progression of events is identical to the case where no "conditioning" circuit is used.

Due to the rising edge 516 on the input of flip-flop 404, the output 418 of flip-flop 404 will change state to high (rising edge 530). The rising edge 530 causes the state of the feedback signal to the multiplexer input 414 to switch (falling edge 534). It also provides the rising edge 538 on the other feedback path 426 to its clear pin. The falling edge 534 will move the clock input of flip-flop 404 back to low (falling edge 540). The rising edge 538 on the clear pin will also reset the output 418 of flip-flop 404, producing the falling edge 544 at the output. Since the output of flip-flop 404 has gone low, the signal on the clear pin also goes low (falling edge 548). At the same time, the feedback path from output 418 to input 414 of the multiplexer 412 will again change state (rising edge 546). This rising edge presents another rising edge for the clock port 424 of flip-flop 404, therefore, the process will continue. The output of flip-flop 404 becomes a series of pulses. Since it is connected to the counter 432, the counter will increment for each pulse from 418. The value of the counter is constantly being compared with the program value. When the counter's value reaches the program value, the compare_out output 436 is asserted (rising edge 550). This signal is used to reset both flip-flop 402 and 404 and the counter 432. By resetting flip-flop 402, the output pulse returns to low, terminating the output pulse (falling edge 554). With the output 454 of flip-flop 402 cleared, the multiplexer 412 now selects input 410. Since the trigger line is already low, flip-flop 404 will not be triggered into another cycle. Once the counter is reset, its value will no longer compare with the program value, so the compare out will also return to low. This completes one trigger event even when input trigger is still high at this time.

While the present invention has been described with respect to specific embodiments, it will be appreciated that the benefits of the invention can be realized using other implementations and configurations without departing from the scope of the claims.

What is claimed is:

1. A one-shot circuit comprising a multi-faceted programmable delay wherein at least one of the delays comprises at least one programmable delay line, while another delay takes the form of a programmable counter, and wherein the one-shot is implemented as at least two flip-flops, and the programmable counter is coupled to a CLR pin of at least one of the flip-flops of the one-shot.

2. A one-shot circuit comprising a multi-faceted programmable delay wherein at least one of the delays comprises at least one programmable delay line, while another delay takes the form of a programmable counter, and wherein the at least one programmable delay line comprises a plurality of delay elements connected to each other through transmission gates selectable by a decoder for selecting one or more of the delay elements.

3. A one-shot circuit comprising at least a first and a second flip-flop, a counter coupled to the CLR pin of at least one of the flip-flops, and further comprising a first feedback loop with an inverter from an output of the second flip-flop to a clock input of the second flip-flop, and a second feedback loop from an output of the second flip-flop to the CLR input of the second flip-flop.

4. A circuit of claim 3 wherein the first feedback loop includes a first programmable delay line.

5. A circuit of claim 3, wherein the second feedback loop includes a second programmable delay line.

6. A circuit of claim 4, wherein the second feedback loop includes a second programmable delay line.

7. A circuit of claim 6, wherein the input to the second flip-flop is tied high so that the second flip-flop with its first feedback loop and the inverter in the first feedback loop defines an internal clock, and the first and second programmable delay lines provide an adjustment for the period of the internal clock signal.

8. A one-shot circuit for defining a pulse, comprising a first flip-flop, a second flip-flop defining an internal clock, and a counter, wherein the internal clock causes the counter to count up or down and the counter serves to end the pulse once the counter has counted up to or down from the program value, the circuit further comprising, a first feedback loop extending from an output of the second flip-flop to a clock input of the second flip-flop, a second feedback loop extending from the output of the second flip-flop to a clear input of the second flip-flop, and and a programmable delay line in at least one of the feedback loops for adjusting the period of the internal clock pulse by a predefined amount.

9. A circuit of claim 8, wherein the counter resets the first flip-flop by being coupled to a clear input of the first flip-flop.

10. A circuit of claim 9, wherein the counter is also coupled to a clear input of the second flip-flop.

\* \* \* \* \*